(12) United States Patent
Tabata et al.

(10) Patent No.: US 9,966,342 B2
(45) Date of Patent: May 8, 2018

(54) BLACK MARKER COMPOSITION AND AN ELECTRONIC COMPONENT USING THESE

(71) Applicant: TDK CORPORATION, Tokyo (JP)

(72) Inventors: Misaki Tabata, Tokyo (JP); Kazunari Kimura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1050 days.

(21) Appl. No.: 14/220,482

(22) Filed: Mar. 20, 2014

(65) Prior Publication Data

US 2014/0299016 A1    Oct. 9, 2014

(30) Foreign Application Priority Data

Apr. 4, 2013 (JP) .................................. 2013-078934

(51) Int. Cl.
| | | |
|---|---|---|
| *H01L 23/544* | (2006.01) | |
| *H01G 2/24* | (2006.01) | |
| *C09D 11/52* | (2014.01) | |
| *C09D 11/037* | (2014.01) | |

(52) U.S. Cl.
CPC ............ *H01L 23/544* (2013.01); *H01G 2/24* (2013.01); *C09D 11/037* (2013.01); *C09D 11/52* (2013.01); *H01L 2223/54426* (2013.01); *H01L 2223/54486* (2013.01); *H01L 2924/0002* (2013.01)

(58) Field of Classification Search
CPC .................. C09D 11/52; C09D 11/037; H01L 2924/0002; H01L 2924/00; H01L 2223/54426; H01L 2223/54486; H01L 23/544; H01G 2/24
See application file for complete search history.

(56) References Cited

U.S. PATENT DOCUMENTS

| | | | | |
|---|---|---|---|---|
| 8,207,670 | B2 * | 6/2012 | Park .......................... | H01B 1/22 252/512 |
| 2008/0224102 | A1 * | 9/2008 | Lee ........................... | H01B 1/22 252/514 |
| 2010/0230646 | A1 * | 9/2010 | Smith ...................... | B82Y 30/00 252/519.13 |
| 2010/0248579 | A1 * | 9/2010 | Komaki ..................... | H01J 9/02 445/58 |

FOREIGN PATENT DOCUMENTS

| | | |
|---|---|---|
| CN | 102097190 A | 6/2011 |
| JP | S62-3044 A | 1/1987 |
| JP | S63-210058 A | 8/1988 |
| JP | A-11-135301 | 5/1999 |
| JP | A-2005-64267 | 3/2005 |
| JP | 2005-097084 A | 4/2005 |
| JP | A-2008-21752 | 1/2008 |
| JP | 2010-077197 A | 4/2010 |
| WO | 2007/060774 A1 | 5/2007 |

* cited by examiner

*Primary Examiner* — Veronica F Faison
(74) *Attorney, Agent, or Firm* — Oliff PLC

(57) ABSTRACT

The object of the present invention is to provide a black marker composition capable of forming non-metal marker which sufficiently ensures the adhering strength and the contrast against the foundation; the electronic component comprising the marker made of said black marker composition, and further the communication device comprising said electronic component.

The marker composition according to the present invention comprises a borosilicate glass, and a black oxide including Cr, Mn and one or more elements selected from the group consisting of Fe, Ni, Cu and Co.

22 Claims, 1 Drawing Sheet

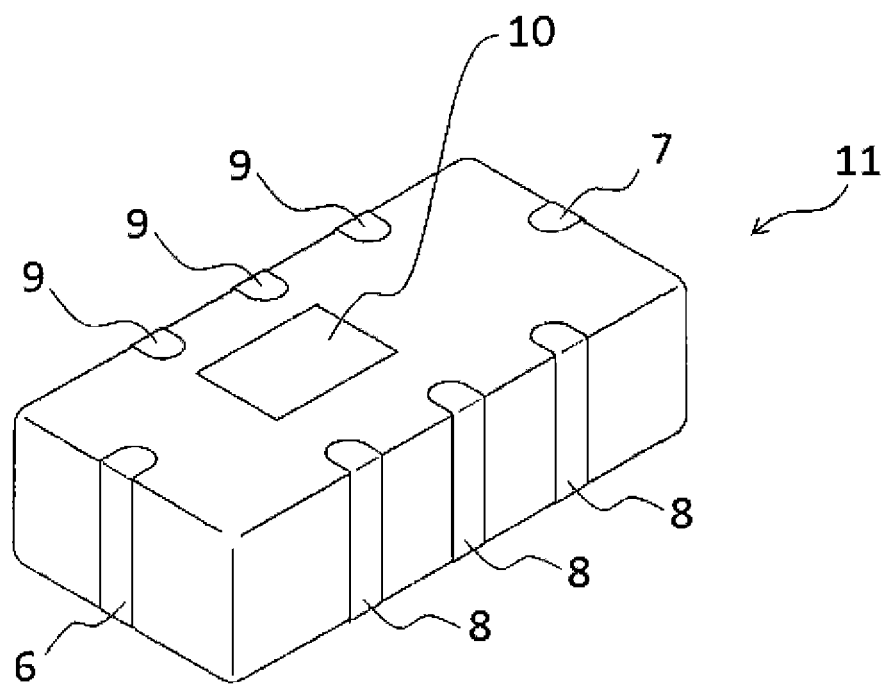

US 9,966,342 B2

BLACK MARKER COMPOSITION AND AN ELECTRONIC COMPONENT USING THESE

BACKGROUND OF THE INVENTION

Field of the Invention

The present invention relates to a black marker composition and an electronic component comprising a marker made of said black marker composition, and further relates to a communication device comprising said electronic component.

Background Art

A multilayered electronic component is provided, in some case, with a marker on the upper face of the multilayer body in order to avoid the mistake during the mounting or the production by specifying the direction of the mounting. Ba—Nd—Ti based ceramic having high $\in$ or Q is well known as the material suitable for a high frequency component. As for the marker of the multilayered electronic component using this Ba—Nd—Ti based ceramic, the marker material consisting of a metal material is widely used (the patent document 1 and 2).

However, the marker consisting of such metal material needs to consider the short circuit with the terminal electrode, thus the shape or the position or so of the marker is limited. Also, when forming the marker on the upper face of the multilayered body, if the marker is directly formed on the foundation of the multilayered body, then the stray capacitance or the capacity coupling may occur between the marker consisting of the metal material and the dielectric material constituting the foundation of the multilayered body.

Especially recently, such problems have become prominent as the demands to make the product further compact and with higher characterization have become stronger. That is, in case the marker is consisting of metal, as the product is made smaller, the distance between the electrode and the marker becomes smaller, thus such spaces are easy to contact which then easily causes the short circuit.

In order to solve such problem, the technique to form the marker by the material other than the metal material has been proposed (the patent document 3). However, in case of forming the marker by the material other than the metal material, there may be problems as mentioned in below depending on the material.

For example, it is necessary to include the low temperature sintering agent when using Ba—Nd—Ti based foundation material as the foundation of the multilayered body for firing Ag electrode and the foundation material together. Such sintering agent component easily reacts with other substances, hence when a glass material is used as the marker material, the glass component crystallizes and causes the adhering strength between the foundation and the marker to become lower.

Also, when the pigment is used as the marker material, the color changes before and after the firing, and the contrast between the foundation and the marker is compromised.

PATENT DOCUMENTS

[Patent document 1] JP Patent Application Laid Open No. 2005-64267
[Patent document 2] JP Patent Application Laid Open No. 2008-21752
[Patent document 3] JP Patent Application Laid Open No. H11-135301

SUMMARY OF THE INVENTION

The Problems to be Solved by the Invention

The present invention was achieved in view of such circumstances, and the object of the present invention is to provide a black marker composition capable of forming non-metal marker which sufficiently ensures the adhering strength and the contrast against the foundation; the electronic component comprising the marker made of said black marker composition, and further the communication device comprising said electronic component.

Means for Solving the Problem

In order to achieve the above mentioned object, the marker composition according to the first aspect of the present invention comprises a borosilicate glass, and a black oxide including Cr, Mn and one or more elements selected from the group consisting of Fe, Ni, Cu and Co.

In order to achieve the above mentioned object, the marker composition according to the second aspect of the present invention comprises a borosilicate glass, and a black oxide including Cr and Fe.

In order to achieve the above mentioned object, the marker composition according to the third aspect of the present invention comprises a borosilicate glass, a crystallized glass, and a black oxide including Cr, Mn and one or more elements selected from the group consisting of Fe, Ni, Cu and Co.

In order to achieve the above object, the marker composition according to the fourth aspect of the present invention comprises a borosilicate glass, a crystallized glass, and a black oxide including Cr and Fe.

According to the marker composition of the first to fourth aspects of the present invention, the non-metal marker capable of sufficiently ensuring the adhering strength and the contrast against the foundation material can be formed.

Preferably, the above mentioned crystallized glass includes two or more compounds selected from the group consisting of $Nd_2O_5$, $TiO_2$, $BaO$, $ZnO$, $MgO$, $B_2O_3$ and $SiO_2$.

Preferably, the above mentioned marker composition comprises one or more compounds selected from the group consisting of $\alpha$-$SiO_2$, $Al_2O_3$, $TiO_2$, $ZrO_2$, $Mg_2SiO_4$, and strontium feldspar.

Also, the electronic component according to the present invention comprises the marker made of the above mentioned black marker composition.

Also, the electronic component according to the present invention comprises an electronic component element having Ba—Nd—Ti based ceramic composition as the main component.

Also, the communication device according to the present invention comprises above mentioned electronic component.

BRIEF DESCRIPTION OF DRAWINGS

FIG. 1 is an electronic component according to the first embodiment of the present invention.

DETAILED DESCRIPTION OF THE INVENTION

Hereinafter, the present invention will be described based on the embodiment shown in the FIGURE.

The First Embodiment (The Electronic Component 11)

As shown in FIG. 11, the high frequency filter 11 as the electronic component according to the first embodiment of the present invention has the main body multilayered part 1 as the main part, and comprises terminal electrodes 6 to 9 which are formed to the main body multilayered part 1. The terminal electrodes 6 to 9 are electrically connected with the internal electrode of the main body multilayered part, and also other than forming on the end part as shown in FIG. 1, it is possible to form on the back face of the main body multilayered part 1. Further, at the surface of the main body multilayered part 1, the marker 10 for indicating the direction is formed.

(The Main Body Multilayered Part 1)

The main body multilayered part 1 is not particularly limited, however it has a constitution wherein plurality of dielectric layers and internal electrode layers are stacked, and sintered simultaneously.

The dielectric layer is not particularly limited; however it is made of the dielectric ceramic material capable of being sintered simultaneously with the internal electrodes. Preferably, the dielectric ceramic material forming the dielectric layer comprises Ba—Nd—Ti based ceramic composition as the main component. Ba—Nd—Ti based ceramic composition has high $\in$ and it can be sintered at low temperature, thus it is suitable even in case of using Ag or so as the internal electrode.

The internal electrode layer is not particularly limited, however it includes Ag as the conductive material, and for example Ag, Ag alloy (e.g. Ag—Pd alloy, Ag including small amount of Zr) or so are preferably the conductor.

(The Terminal Electrodes 6 to 9)

The conductive material comprised in the terminal electrodes is not particularly limited, however in the present embodiment, Ag, Cu and alloy thereof can be used.

(The Marker 10)

The shape of the marker 10 is not particularly limited, and it can be suitably selected from parallel piped shape, triangular shape, sphere shape or so. The area of the marker is not particularly limited, and it can be appropriate size depending on the use. Also the thickness thereof is not particularly limited.

The marker 10 is constituted by the black marker composition according to the present invention.

(the Black Marker Composition)

The black marker composition of the present invention comprises a borosilicate glass, and a black oxide including Cr, Mn and one or more elements selected from the group consisting of Fe, Ni, Cu and Co.

By satisfying the above mentioned constitution, the black marker composition according to the present embodiment can form the non-metal marker which can sufficiently ensure the adhering strength and the contrast against the foundation material.

Also, since the black marker composition according to the present embodiment is made of non-mental marker composition, even if the electrode pattern is positioned near the marker, the stray capacitance does not occur, and the short circuit does not occur even if the terminal electrode and the marker contacts. Therefore, according to such black marker composition, the shape or the position of the marker, and further the shape of the terminal electrodes or so can be freely set; hence the electronic component can be made compact.

The borosilicate glass is not particularly limited, and commercially available glass can be used. Preferably, $Al_2O_3$—BaO—$SiO_2$—$B_2O_3$ based glass or so can be used.

The content of the borosilicate glass in the black marker composition is preferably 55 to 95 wt %, and more preferably 75 to 85 wt %. By having the content of the borosilicate glass with in the above mentioned range, the non-metal marker which can sufficiently ensure the adhering strength and the contrast against foundation material can be formed.

The black oxide includes Cr, Mn, and one or more element selected from the group consisting of Fe, Ni, Cu and Co. As such black oxide, it is not particularly limited, however for example the black oxide including Cr, Mn, Fe and Ni, the black oxide including Cr, Mn, Co, the black oxide including Cr, Mn and Cu or so are preferable. Among these, the black oxides including Cr, Mn, Fe and Ni are more preferable since the marker having excellent contrast against the foundation, and having an excellent adhering strength after the plating can be formed.

The content of the black oxides in the black marker composition is preferably 5 to 25 wt %, and more preferably 10 to 15 wt %. By having the content of the black oxide within said range, the non-metal marker which can sufficiently ensure the adhering strength and the contrast against foundation material can be formed.

The black marker composition according to the present embodiment may further comprise, besides the above mentioned constitution components, the crystallized glass depending on the needs.

The crystallized glass is not particularly limited, and the commercially available glass can be used, and preferably it crystallizes at the temperature of firing temperature or higher (preferably 910° C. or higher). As such crystallized glass, for example $Nd_2O_3$—$TiO_2$—BaO—ZnO—$SiO_2$ based glass or so may be mentioned.

In case the black marker composition according to the present embodiment includes the crystallized glass, the total content of the borosilicate glass and the crystallized glass in the black marker composition is preferably 55 to 95 wt %, and more preferably 75 to 85 wt %. Further, the content of the crystallized glass in the black marker composition is preferably 0 to 50 wt %, and more preferably 0 to 30 wt %. By having each of the content within said range, the non-metal marker which can sufficiently ensure the adhering strength and the contrast against foundation material can be formed. Note that, if the content of the glass is lowered, the adhering strength tends to decline.

Also, the black oxide composition according to the present embodiment preferably further comprises α-$SiO_2$, $Al_2O_3$, $TiO_2$, $ZrO_2$, $Mg_2SiO_4$, and strontium feldspar.

The content of the above mentioned oxide of $ZrO_2$ or so in the black marker composition is preferably 0 to 20 wt %, and more preferably 5 to 15 wt %. By having the content of the above mentioned oxides such as $ZrO_2$ or so within said range, the non-metal marker which can sufficiently ensure the adhering strength and the contrast against foundation material can be formed. Also, such oxides are suitable for controlling the contraction ratio to be same as the foundation material.

(The Production Method of the Electronic Component)

One example of the production method of the electronic component 11 according to the present embodiment will be explained.

The Method of Forming of the Marker (the Black Marker Composition)

The method of forming the marker is not particularly limited as long as it is a method which can form the marker uniformly, and for example, the screen printing method or a gravure printing method using the internal electrode layer paste, the thick membrane forming method such as offset method or so may be mentioned. In the present embodiment, the screen printing method will be used.

The marker paste used in the present embodiment comprises borosilicate glass; the black oxide including Cr, Mn and one or more elements selected from the group consisting of Fe, Ni, Cu and Co; the crystallized glass which is added depending on the needs and the predetermined oxides such as $ZrO_2$ or so; the solvent, and organic vehicle or so. The marker paste is formed by making these components into a paste form.

Note that, as for the material when producing the marker paste, besides the above mentioned components, various oxides which becomes the component of the black marker composition mentioned in the above after firing, the organic metal compound, or resinate or so can be used.

As the shape of the black marker composition raw material, it is not particularly limited, and it may be spherical shape, scale shape or so, and also these shape may be mixed as well. Also, the average particle diameter of various material powders is preferably 0.8 to 1.2 μm or so.

In the present embodiment, as the binder resin included in the marker paste, ethylcellulose, polyvinylbutyral or so may be mentioned, however ethylcellulose is preferably used. The binder resin is preferably included 4 to 15 parts by weight with respect to 100 parts by weight of the black marker composition raw material (borosilicate glass, the predetermined black oxides, the crystallized glass which is added depending on the needs, and the predetermined oxides such as $ZrO_2$ or so).

In the present embodiment, as the organic solvent of the marker paste, preferably those which are incompatible with the green sheet paste is used. As the solvent of the marker paste, for example, terpineol, dihydroterpineol or so may be mentioned; however preferably dihydroterpineol is used. The solvent content of the marker paste is preferably 20 to 55 wt % or so with respect to the entire marker paste.

In the present embodiment, depending on the needs, the dispersants, the plastisizer, the tackifier, and other additives may be added in the marker paste. As a result, uniform marker can be formed, and the adhering strength is enhanced.

The Formation of the Main Body Multilayered Part 1

First, the internal electrode paste is printed to the green sheet consisting of desired dielectric material, thereby the green sheet formed with the internal electrode paste layer is prepared. The internal electrode paste layer is a part which becomes an internal electrode layer after firing.

Further, the marker paste is printed on the green sheet, thereby the green sheet formed with pre-fired marker is prepared. The pre-fired marker is a part which becomes the marker 10 after firing.

First, the green sheet formed with the pre-fired marker and the green sheet formed with the internal electrode paste layer is stacked, and by cutting said multilayered body into a predetermined shape, the green ship is obtained. At this time, each green sheet is stacked so that the face formed with the marker becomes the surface. Alternatively, the green sheet is stacked without forming the pre-fired marker, and the pre-fired marker can be formed by printing or so at the backside of the multilayered body.

The green sheet can be all formed by the same dielectrics, however it may be formed by plurality of dielectrics which can be fired simultaneously. Preferably, the green sheet formed with the pre-fired marker comprises Ba—Nd—Ti based ceramic composition as the main component.

The multilayered body is cut into a desired shape. Next, the binder removal treatment, and the firing treatment are carried out. The conditions for these are the generally known conditions.

As mentioned in the above, the binder removal treatment, and firing are carried out and thereby the main body multilayered part 1 can be obtained. To the main body multilayered part 1, the external electrode paste is printed or transferred, then fired; thereby the terminal electrodes 6 to 9 are formed. Then, depending on the needs, to the surface of the terminal electrodes 6 to 9, the coating layer is formed by plating or so. As such, the high frequency filter 11 is produced. The high frequency filter 11 is mounted on the print board or so by soldering or so, thereby it is used for various electronic devices.

Particularly, the electronic components according to the present invention can be suitably used for PC, smart phones, communication devices such as portable communication terminals or so.

The Second Embodiment

The black marker composition according to the present embodiment is as same as the first embodiment, except that the black oxides are different. Hence the overlapping part will be omitted from explaining.

The back oxides according to the present embodiment include Cr and Fe.

The content of the black oxide in the black marker composition according to the present embodiment is preferably 5 to 25 wt %, and more preferably 5 to 15 wt %. By having the content of the black oxides with said range, the non-metal marker which can sufficiently ensure the adhering strength and the contrast against foundation material can be formed.

Hereinabove, the embodiments of the present invention have been described, however the present invention is not to be limited to such embodiments, and it is obvious that various embodiments can be carried out within the range which does not exceed the scope of the present invention.

For example, as the black marker composition according to the present embodiment, besides the component described in the above, the oxides of the inevitable impurities may be included by several ppm to several hundred ppm or so in the raw material.

Also, in the present embodiment, the green sheet formed with the marker is stacked to form the green chip, and then the firing is carried out simultaneously. However, the marker may be formed after the green chip is obtained then the firing may be carried out simultaneously, or the marker may be formed on the multilayered body being fired then it can be fired at predetermined temperature.

Also, in the present embodiment, the marker is formed directly on the foundation (the green sheet, the dielectric ceramic composition after the firing), however according to the black marker composition of the present invention, it may be formed on the electrodes formed on the foundation.

Also, in the above mentioned embodiment, the high frequency filter was mentioned as the example of the electronic component according to the present invention, however the electronic component according to the present invention is not limited to the multilayered filter, and it may be used as the multilayered electronic component such as multilayered inductor or so. Also, the black marker composition of the present invention can be used, for example to the electrode protection layer or so. Also, as the purpose of the marker, not only it is used to determine the direction during the mounting of the electronic component, it is also used for the alignment marker during the production or the label of the product or so.

EXAMPLE

Hereinafter, the present invention will be explained based on the examples, however the present invention is not to be limited to these examples.

Example 1

[The Preparation of the Marker Paste]

First, the black oxides of the composition shown in Table 1 were prepared. 10 parts by weight of said black oxides, 75 parts by weight of $Al_2O_3$—BaO—$SiO_2$—$B_2O_3$ based glass, 15 parts by weight of $ZrO_2$ were mixed, then 13 parts by weight of ethylcellulose as the organic binder and 50 parts by weight of butyl carbitol, with respect to 100 parts by weight of the mixture, were added, then these were mixed under room temperature, thereby the marker paste was obtained.

[The Production of the Samples for the Evaluation]

Next, the obtained marker paste was screen printed at the predetermined position of the Ba—Nd—Ti based ceramic green sheet which becomes the dielectric layer. Note that, the thickness of the green sheet was 40 μm. Also, the size of the marker which was screen printed was parallelepiped shape of 0.6 mm×0.6 mm, and the thickness of the marker was 25 μm or so.

Then, the plurality of green sheets which has been printed with the Ag conductor paste in advance were stacked, and the green sheet printed with the marker paste was further printed, then it was stacked so that the face which has been printed with the marker paste is on the surface, thereby the multilayered body was obtained.

Next, this multilayered body was cut into predetermined size, and the green chip was obtained. Then, the green chip was heated to carry out the binder removing treatment. Then, the green chip was fired at 910° C. to form the sintered body; thereby the sample for the evaluation was made.

[Evaluation]

The Peeling Test

During the peeling test, the adhesive tape was pasted on the marker part of the sample for the evaluation then peeled off, and the ratio of having a peel off at the marker part during the peeling off was set as the defective ratio. In the present invention, the defective ratio of 60% or less is shown as "x", and the defective ratio of 40% or less is shown as "Δ", the defective ratio of 20% or less is shown as "○", and the defective ratio of 0% is shown as "⊚". The results are shown in Table 1.

The Contrast Test

As for the contrast test, it was examined whether the direction recognition marker were able to be recognized by the image recognition of the camera. The ratio of the test samples which were unable to recognize the direction recognition marker by the image recognition was set as the defective ratio. In the present examples, the defective ratio of 60% or less is shown as "x", and the defective ratio of 40% or less is shown as "Δ", the defective ratio of 20% or less is shown as "○", and the defective ratio of 0% is shown as "⊚". The results are shown in Table 1.

TABLE 1

| Sample No. | Cr | Mn | Fe | Ni | Cu | Co | Peeling | Contrast |
|---|---|---|---|---|---|---|---|---|
| 1 | ○ | ○ | ○ | ○ |   |   | ⊚ | ⊚ |
| 2 | ○ | ○ |   |   |   | ○ | ⊚ | ○ |
| 3 | ○ | ○ |   |   | ○ |   | ⊚ | ○ |
| 4 | ○ |   | ○ |   |   |   | ⊚ | Δ |
| 5 |   | ○ | ○ |   |   |   | ⊚ | X |
| 6 | ○ |   |   |   | ○ |   | ⊚ | X |
| 7 | ○ |   |   |   |   |   | Insufficient sinter | |
| 8 |   | ○ |   |   |   |   | Insufficient sinter | |
| 9 |   |   | ○ |   |   |   | Insufficient sinter | |
| 10 |   |   |   | ○ |   |   | Insufficient sinter | |
| 11 |   |   |   |   | ○ |   | Insufficient sinter | |
| 12 |   |   |   |   |   | ○ | Insufficient sinter | |

As shown in Table 1, in case the black oxides which satisfies the present invention is used, the evaluation results of the peeling and the contrast were both excellent (the sample numbers 1 to 4).

On the other hand, in case the black oxides which does not satisfy the present invention is used, the contrast was insufficient, or it was not sufficiently sintered (the sample numbers 5 to 12).

Example 2

The sample for the evaluation was prepared and evaluated as same as the example 1, except for using the marker paste as shown in below. The results are shown in Table 2,

[The Preparation of the Marker Paste]

First, the black oxide having the composition shown in Table 2 was prepared. 10 parts by weight of said black oxide, 45 parts by weight of $Al_2O_3$—BaO—$SiO_2$—$B_2O_3$ based glass, 30 parts by weight of $Nd_2O_3$—$TiO_2$—BaO—ZnO—$SiO_2$ based glass, 15 parts by weight of $ZrO_2$ were mixed; and 13 parts by weight of ethylcellulose as the organic binder and 50 parts by weight of butylcarbitol, with respect to 100 parts by weight of said mixture, were added and these were mixed under the room temperature; thereby the marker paste was obtained.

TABLE 2

| Sample No. | Cr | Mn | Fe | Ni | Cu | Co | Peeling | Contrast |
|---|---|---|---|---|---|---|---|---|
| 21 | ○ | ○ | ○ | ○ |   |   | ⊚ | ○ |
| 22 | ○ | ○ |   |   |   | ○ | ⊚ | ○ |
| 23 | ○ | ○ |   |   | ○ |   | ⊚ | ○ |
| 24 | ○ |   | ○ |   |   |   | ⊚ | Δ |
| 25 |   | ○ | ○ |   |   |   | ⊚ | X |
| 26 | ○ |   |   |   | ○ |   | ⊚ | X |
| 27 | ○ |   |   |   |   |   | Insufficient sinter | |
| 28 |   | ○ |   |   |   |   | Insufficient sinter | |
| 29 |   |   | ○ |   |   |   | Insufficient sinter | |
| 30 |   |   |   | ○ |   |   | Insufficient sinter | |
| 31 |   |   |   |   | ○ |   | Insufficient sinter | |
| 32 |   |   |   |   |   | ○ | Insufficient sinter | |

As shown in Table 2, in case the black oxides which satisfies the present invention is used, the evaluation results of the peeling and the contrast were both excellent (the sample numbers 21 to 24).

On the other hand, in case the black oxides which does not satisfy the present invention is used, the contrast was insufficient, or it was not sufficiently sintered (the sample numbers 25 to 32).

Example 3

The sample for the evaluation was prepared and evaluated as same as the example 1, except for using the marker paste as shown in below. The results are shown in Table 3.

[The Preparation of the Marker Paste]

First, the oxides shown in Table 3 were prepared. Then, 15 parts by weight of said oxides, 10 parts by weight of the black oxides including Cr, Mn, Fe and Ni, and 85 parts by weight of $Al_2O_3$—BaO—$SiO_2$—$B_2O_3$ based glass were mixed, 13 parts by weight of ethylcellulose as the organic binder and 50 parts by weight of butylcarbitol, with respect to 100 parts by weight of said mixture, were added and these were mixed under the room temperature, thereby the marker paste was obtained.

Note that, as for the marker paste using the combination of two or more oxides among the oxides shown in Table 3, each oxide was added so that the oxides have the equal parts respectively (the sample numbers 47 to 49).

TABLE 3

| Sample No. | $ZrO_2$ | α-$SiO_2$ | $Al_1O_3$ | $TiO_2$ | $Mg_2SiO_4$ | Stontium feldspar | Peeling | Contrast |
|---|---|---|---|---|---|---|---|---|
| 41 | ○ | | | | | | ◎ | ◎ |
| 42 | | ○ | | | | | ◎ | Δ |
| 43 | | | ○ | | | | ◎ | Δ |
| 44 | | | | ○ | | | ◎ | ◎ |
| 45 | | | | | ○ | | ◎ | Δ |
| 46 | | | | | | ○ | ◎ | Δ |
| 47 | ○ | ○ | ○ | | | | ◎ | Δ |
| 48 | ○ | | ○ | | | | ◎ | ○ |
| 49 | ○ | | | | ○ | | ◎ | ○ |

As shown in Table 3, by using α-$SiO_2$, $Al_2O_3$, $TiO_2$, $ZrO_2$, $Mg_2SiO_4$, and strontium feldspar, it was confirmed that the marker which ensures the sufficient adhering strength and the contrast between the foundations can be obtained (the sample numbers 41 to 49).

Example 4

The sample for the evaluation was prepared and evaluated as same as the example 1, except for using the marker paste as shown in below. The results are shown in Table 4.

[The Preparation of the Marker Paste]

The black oxides including Cr, Mn, Fe and Ni, $Al_2O_3$—BaO—$SiO_2$—$B_2O_3$ based glass, $Nd_2O_3$—$TiO_2$—BaO—ZnO—$SiO_2$ based glass, and $ZrO_2$ were mixed so that it satisfies the composition shown in Table 4; then 13 parts by weight of ethylcellulose as the organic binder and 50 parts by weight of butylcarbitol, with respect to 100 parts by weight of said mixture, were added and these were mixed under the room temperature, thereby the marker paste was obtained.

TABLE 4

| Sample No. | Borosilicate glass wt % | Crystallized glass wt % | Black oxides wt % | $ZrO_2$ wt % | Peeling | Contrast |
|---|---|---|---|---|---|---|
| 51 | 95 | 0 | 5 | 0 | ○ | ◎ |
| 52 | 85 | 0 | 10 | 5 | ◎ | ◎ |
| 53 | 75 | 0 | 10 | 15 | ◎ | ◎ |
| 54 | 55 | 0 | 25 | 20 | ◎ | Δ |
| 55 | 45 | 30 | 10 | 15 | ◎ | ○ |
| 56 | 25 | 50 | 10 | 15 | Δ | ○ |

Even in case the content of each components are variously changed, it was confirmed that the marker which ensures the sufficient adhering strength and the contrast between the foundations can be obtained (the sample numbers 51 to 56).

NUMERICAL REFERENCES

1 . . . The multilayered main body
10 . . . The marker
11 . . . The electronic component

The invention claimed is:

1. A black marker composition comprising:
   a borosilicate glass, and
   a black oxide including Cr, Mn and one or more elements selected from the group consisting of Fe, Ni, Cu and Co, wherein
   the borosilicate glass is 45 to 85 wt % of the black marker composition.

2. A black marker composition comprising:
   a borosilicate glass, and
   a black oxide including Cr and Fe, wherein
   the borosilicate glass is 45 to 85 wt % of the black marker composition.

3. A black marker composition comprising:
   a borosilicate glass,
   a crystallized glass, and
   a black oxide including Cr, Mn and one or more elements selected from the group consisting of Fe, Ni, Cu and Co, wherein
   the borosilicate glass is 45 to 85 wt % of the black marker composition.

4. A black marker composition comprising:
   a borosilicate glass,
   a crystallized glass, and
   a black oxide including Cr and Fe, wherein
   the borosilicate glass is 45 to 85 wt % of the black marker composition.

5. The black marker composition as set forth in claim 3 wherein said crystallized glass includes two or more compounds selected from the group consisting of $Nd_2O_5$, $TiO_2$, BaO, ZnO, MgO, $B_2O_3$ and $SiO_2$.

6. The black marker composition as set forth in claim 4 wherein said crystallized glass includes two or more compounds selected from the group consisting of $Nd_2O_5$, $TiO_2$, BaO, ZnO, MgO, $B_2O_3$ and $SiO_2$.

7. The black marker composition as set forth in claim 1 further comprising one or more compounds selected from the group consisting of α-$SiO_2$, $Al_2O_3$, $TiO_2$, $ZrO_2$, $Mg_2SiO_4$, and strontium feldspar.

8. The black marker composition as set forth in claim 2 further comprising one or more compounds selected from the group consisting of α-$SiO_2$, $Al_2O_3$, $TiO_2$, $ZrO_2$, $Mg_2SiO_4$, and strontium feldspar.

9. The black marker composition as set forth in claim 3 further comprising one or more compounds selected from the group consisting of α-$SiO_2$, $Al_2O_3$, $TiO_2$, $ZrO_2$, $Mg_2SiO_4$, and strontium feldspar.

10. The black marker composition as set forth in claim 4 further comprising one or more compounds selected from the group consisting of α-$SiO_2$, $Al_2O_3$, $TiO_2$, $ZrO_2$, $Mg_2SiO_4$, and strontium feldspar.

11. An electronic component comprising a marker made of the black marker composition as set forth in claim 1.

12. An electronic component comprising a marker made of the black marker composition as set forth in claim 2.

13. An electronic component comprising a marker made of the black marker composition as set forth in claim 3.

14. An electronic component comprising a marker made of the black marker composition as set forth in claim 4.

15. The electronic component as set forth in claim 11 wherein an electronic component element has Ba—Nd—Ti based ceramic composition as a main component.

16. The electronic component as set forth in claim 12 wherein an electronic component element has Ba—Nd—Ti based ceramic composition as a main component.

17. The electronic component as set forth in claim 13 wherein an electronic component element has Ba—Nd—Ti based ceramic composition as a main component.

18. The electronic component as set forth in claim 14 wherein an electronic component element has Ba—Nd—Ti based ceramic composition as a main component.

19. A communication device comprising the electronic component as set forth in claim 11.

20. A communication device comprising the electronic component as set forth in claim 12.

21. A communication device comprising the electronic component as set forth in claim 13.

22. A communication device comprising the electronic component as set forth in claim 14.

* * * * *